(12) United States Patent
Etschmaier et al.

(10) Patent No.: US 10,734,534 B2
(45) Date of Patent: Aug. 4, 2020

(54) METHOD OF PRODUCING AN OPTICAL SENSOR AT WAFER-LEVEL AND OPTICAL SENSOR

(71) Applicant: ams AG, Unterpremstaetten (AT)

(72) Inventors: Harald Etschmaier, Graz (AT); Gregor Toschkoff, Graz (AT); Thomas Bodner, Seiersberg (AT); Franz Schrank, Graz (AT)

(73) Assignee: ams AG, Unterpremstaetten (AT)

( * ) Notice: Subject to any disclaimer, the term of this patent is extended or adjusted under 35 U.S.C. 154(b) by 48 days.

(21) Appl. No.: 15/746,342

(22) PCT Filed: Jul. 22, 2016

(86) PCT No.: PCT/EP2016/067563
§ 371 (c)(1),
(2) Date: Jan. 19, 2018

(87) PCT Pub. No.: WO2017/013256
PCT Pub. Date: Jan. 26, 2017

(65) Prior Publication Data
US 2018/0226514 A1    Aug. 9, 2018

(30) Foreign Application Priority Data

Jul. 23, 2015 (EP) .................................... 15178053

(51) Int. Cl.
*H01L 31/0203* (2014.01)
*H01L 31/0232* (2014.01)
(Continued)

(52) U.S. Cl.
CPC ........ *H01L 31/0203* (2013.01); *G01J 1/0204* (2013.01); *G01J 1/0271* (2013.01);
(Continued)

(58) Field of Classification Search
CPC ....... G01J 1/0204; G01J 1/0271; H01L 31/02; H01L 31/023; H01L 31/153; H01L 31/173
See application file for complete search history.

(56) References Cited

U.S. PATENT DOCUMENTS 6,290,481 B1    9/2001 Huang
7,723,146 B2    5/2010 Chow et al.
(Continued)

FOREIGN PATENT DOCUMENTS

CN    1901235    1/2007
CN    103400836 A1    11/2013
(Continued)

*Primary Examiner* — Marvin Payen
(74) *Attorney, Agent, or Firm* — Fish & Richardson P.C.

(57) ABSTRACT

A method of producing an optical sensor at wafer-level, comprising the steps of providing a wafer having a main top surface and a main back surface and arrange at or near the top surface of the wafer at least one first integrated circuit having at least one light sensitive component. Furthermore, providing in the wafer at least one through-substrate via for electrically contacting the top surface and back surface and forming a first mold structure by wafer-level molding a first mold material over the top surface of the wafer, such that the first mold structure at least partly encloses the first integrated circuit. Finally, forming a second mold structure by wafer-level molding a second mold material over the first mold structure, such that the second mold structure at least partly encloses the first mold structure.

12 Claims, 5 Drawing Sheets

(51) Int. Cl.
    *H01L 31/173*     (2006.01)
    *G01J 1/02*     (2006.01)
    *G01J 5/04*     (2006.01)
    *H01L 23/00*     (2006.01)
    *H01L 31/02*     (2006.01)
    *H01L 31/153*     (2006.01)

(52) U.S. Cl.
    CPC .............. *G01J 5/045* (2013.01); *H01L 24/13* (2013.01); *H01L 31/02005* (2013.01); *H01L 31/02327* (2013.01); *H01L 31/173* (2013.01); *H01L 31/153* (2013.01); *H01L 2224/13025* (2013.01)

(56) References Cited

U.S. PATENT DOCUMENTS

| | | | |
|---|---|---|---|
| 8,378,502 B2 | 2/2013 | Chow et al. | |
| 2007/0018123 A1* | 1/2007 | Sano | G01V 8/12 |
| | | | 250/551 |
| 2007/0176081 A1 | 8/2007 | Stricklin | |
| 2013/0087811 A1 | 4/2013 | Takeshita et al. | |
| 2013/0320471 A1 | 12/2013 | Luan | |
| 2013/0334445 A1 | 12/2013 | Tharumalingam et al. | |
| 2016/0306042 A1 | 10/2016 | Schrank et al. | |

FOREIGN PATENT DOCUMENTS

| | | |
|---|---|---|
| CN | 103512596 | 1/2014 |
| CN | 105793727 | 7/2016 |
| EP | 0682374 A1 | 11/1995 |

\* cited by examiner

METHOD OF PRODUCING AN OPTICAL SENSOR AT WAFER-LEVEL AND OPTICAL SENSOR

BACKGROUND OF THE INVENTION

Optical sensors are electronic detectors that convert light, or a change in light, into an electronic signal. They are used in many industrial and consumer applications. As ambient light sensors (ALS) optical sensors are commonly used to automatically control the brightness of displays depending on the intensity of ambient light, both for user comfort, and for the purpose of conserving battery power in handheld devices.

An optical sensor should robustly respond to light striking a sensor aperture from a wide range of angles. At the same time, the range of angles or field of view should not be too wide as many optical sensors are prone to error when light incidents the sensor surface at large angles. A further source of error constitutes light that does not originate from ambient surroundings but rather comes from within the device itself, e.g. from stray light from a screen display, backlight in a mobile phone or from light emitted by neighboring active sensors. This leads to optical crosstalk and eventually reduction of signal to noise ratio.

Packaging technology aims at reducing the above-mentioned sources of error. Apertures in the sensor package define a range of limiting angles and reduce optical crosstalk from ambient surroundings and neighboring electronic components. Current open cavity package technologies, however, are either complex and therefore costly, or else cannot be used for most wafer-level applications because the requirements on aspect ratio and pin dimensions can be critical (or both).

SUMMARY OF THE INVENTION

According to an aspect of the proposed concept, a method of producing an optical sensor at wafer-level comprises the following steps. A wafer is provided having a main top surface and a main back surface. At least one first integrated circuit is arranged at or near the top surface of the wafer. The first integrated circuit has at least one light sensitive component. Furthermore, the wafer is provided with at least one through substrate via for electrically contacting the top surface and the back surface of the wafer.

A wafer-level package is formed on the wafer by means of wafer-level molding using a first mold structure and a second mold structure. The method of producing the optical sensor thus comprises forming the first molding structure by wafer-level molding a first mold material over the top surface of the wafer. This is done such that the first mold structure at least partly encloses the first integrated circuit. The second mold structure is formed by wafer-level molding the second mold material over the first mold structure. This is done such that the second mold structure at least partly encloses the first mold structure.

The wafer-level molding is an integral part of the whole process flow, which may comprise further steps such as (CMOS) processing of wafer front surface, including the integrated circuit or sensor, deposition of filter structures or similar on the sensor, through silicon via (TSV) processing and re-distribution layer on the wafer back-surface, under-bump metallization (UBM) on the wafer back surface, wafer-level molding of the package, balling or bumping, singulation of single die packages, as well as final testing. The bumping after molding may be done at wafer-level, with subsequent singulation into the final packages. UBM may alternatively be done after the molding step.

The term wafer-level will be understood as being applied on a major portion of a substrate surface in one processing step. For example, no singulation may be done until both first and second mold structures are both molded at wafer-level. However, in general the wafer can be singulated into parts at any moment of the process and manufacture continues by treating the parts separately or at the same time. Consequently, such process can be considered wafer-level as well.

The light sensitive component is sensitive to optical radiation. The term "optical" or "light" in this context refers to electromagnetic radiation in the visible spectrum, e.g. between 400 nm and 800 nm, (near) infrared and ultraviolet. In fact, the term "light sensitive component" will be understood as being sensitive to visual, infrared and ultraviolet electromagnetic radiation if not specified otherwise.

Wafer-level packaging denotes packaging of an integrated circuit while still being part of the wafer, in contrast to slicing the wafer into individual circuits and then packaging them. The wafer comprises a semiconductor material, such as a crystalline silicon, for example.

The method results in the manufacture of one or more optical sensors. These sensors can be used as photosensors, color sensors or ambient light sensors, for example. Furthermore, the sensors can also be used as proximity sensors. It is even possible to add further molding structures in order to manufacture a proximity sensor based on the proposed method.

According to an embodiment, the first mold structure is made at least partly transparent by using an optically transparent mold material as first mold material. Furthermore, the second mold structure is made at least partly opaque by using an optically opaque mold material as second mold material.

Basically, different type of thermosetting materials can be used as molding material. For example, epoxy resins, silicone, polyamides or mixtures thereof can be used as material for both first and second mold structure. These materials can be made optically transparent or opaque by addition of pigments, metal- or nano-particles, dyes or the like.

Optical transparency describes the physical property of light being able to pass through a material. For example, the material used for molding the first molding structure can have a transmission within the visual spectrum between 400 nm and 800 nm or may even be extended into the near infrared up to 1000 nm and/or ultraviolet. Transparency should be high, for example higher than 50%. The actual choice of material, however, depends on the application and desired spectral range. Criteria include sensitivity of the detector to be used with the dispersive element and desired signal to noise ratio.

Opacity is the measure of impenetrability to electromagnetic or other kinds of radiation, especially visible light. The term "opaque" is used to define that a material is neither transparent, i.e. allowing all light to pass through nor translucent, allowing some light to pass through. Opacity, however, is depending on wavelength as well. The term "opaque" in practice denotes that opacity of the molding material is high, at least higher than 50%, or close to 100% for the wavelengths mentioned above.

According to an embodiment, the first mold structure is formed by means of a structured first mold tool. The first mold tool comprises at least a first mold cavity. In particular, the first mold tool comprises a conical or otherwise tapered first mold cavity. The first mold tool is placed at or near the top surface of the wafer, for example, in a certain distance to the wafer or by touching the front surface of the wafer. Then, the first mold material is applied to the cavity via a channel in the mold tool or via a gap left between the mold tool and the wafer front surface to form the first molding structure.

The molding may involve wafer-level liquid compression molding, liquid transfer molding, e.g. film assisted molding, or other molding techniques. The cavity in the first mold tool is shaped such that the resulting first molding structure can be narrow at a top surface, and wider at a bottom surface, i.e. the surface which is adjacent to the light sensitive component of the first integrated circuit. The first mold structure may have a top surface with curvature depending on the shape of the cavity. However, the top surface can also be flat depending on the shape of the cavity.

For example, the bottom surface of the first mold structure may essentially be flush or coplanar with the front surface of the wafer. In fact, the first mold structure may enclose the whole wafer front surface.

According to an embodiment, the second mold structure is formed by means of a flat or structured second mold tool. The second mold tool is placed on the wafer at or near the top surface of the first mold structure. The second mold material is applied to the second mold tool to form the second mold structure and to leave an aperture at or near the top surface of the first mold structure, i.e. the second mold structure does not completely enclose the first mold structure such that light may pass and reach the light sensitive component.

For example, the second mold material is applied on the whole wafer front surface by pressing a flat or structured second mold tool onto the top surface of the first mold structure. The application of the second mold tool can be realized by filling the resulting cavity between the second mold tool and the first mold structure or wafer front surface by means of wafer-level molding.

The resulting overall structure, including the first and second mold structure, constitutes a wafer-level package having a defined total height. An exposed top of the first mold structure is free of second mold material such that an aperture is established over the first integrated circuit as mentioned above. The second mold structure provides sidewalls, for example, opaque sidewalls, that can block a large part of light incident from the side of the optical sensor from reaching the light sensitive component.

Furthermore, the top surface of the first molding structure can be flat, or can also contain compound curvatures, for example even optical lens shape. The top surface of the first molding structure may be deformed by the pressure of the second mold tool, and may subsequently standout of the top surface of the second mold structure in the final package. However, both first and second mold structure can be made coplanar with respect to each other in a surface processing step, for example, etching or slicing.

According to an embodiment, one or more additional flat or structured molding layers are applied to the wafer at or near the top surface of the second mold structure. In particular, one or more diffusive layers can be applied to the wafer.

For example, the addition of further molding layers can be applied to the whole wafer. The application can be done by aligning a flat or structured mold tool at a defined distance parallel to a top surface of the second mold structure, and by filling the resulting cavity with mold material. For example, transparent mold material can be mixed with light scattering particles in order to manufacture a diffuser layer.

In an embodiment, a redistribution layer is provided before or after wafer-level molding the first and second molding structure. The redistribution layer comprises at least one metal layer which is arranged on the back surface of the wafer. Furthermore, the at least one through substrate via is electrically connected with the distribution layer.

In an embodiment, the redistribution layer is provided with an under-bump layer comprising one or more bumps. In particular, the under-bump layer is provided either before or after wafer-level molding of the first and second molding structure.

Furthermore, one or more through substrate vias contact the front surface of the wafer to the redistribution layer at the back surface. Individual bumps may be applied to the back surface on a wafer-level after molding of the first and second molding structure.

In an embodiment, the wafer is provided with a plurality of first integrated circuits each having a light sensitive component. The first and second mold structure are applied to the larger part of the wafer. In particular, the first and second mold structure are applied to the whole front surface of the wafer. In a final step, the wafer is singulated into individual optical sensors each comprising at least one of the first integrated circuits.

In an embodiment, the structured first mold tool comprises a plurality of cavities each of which are interconnected by channels allowing mold material to flow between the cavities during wafer-level molding. The mold material, in more detail the first mold material, can be applied through the channels to flow into each of the cavities in the first mold tool by means of wafer-level molding. In other words, the channels connect the different cavities in the first mold tool to allow mold to distribute between them during molding.

This way, a certain amount of first mold material is placed on the wafer as a result of flowing through the channels between the cavities during wafer-level molding. This structure will be denoted a "runner" hereinafter. The runner or several runners interconnect the first mold structure from the individual cavities.

In an embodiment, at least one runner comprising first mold material resulting from flowing through the channels between the cavities during wafer-level molding is at least partly removed. In particular, removal is realized by means of isotropic or anisotropic etching and/or by means of mechanical removal such as sawing or dicing.

For example, the runners can be removed by dicing, equivalent masked or unmasked isotropic or anisotropic etching process, respectively, and before application of the second mold structure. For a complete removal of the runners by dicing the runner can be cut. The cut can be as deep into the substrate of the wafer as is necessary to ensure a complete removal of the mold material.

In an embodiment, the at least one runner is at least partly replaced by a thin layer distributed throughout the wafer front surface.

Furthermore, the runner or thin layer can be further reduced or partially reduced, e.g. to reduce incidence surface light through the runner or thin layer. This may be done after molding of the first to molding structure, for example, a part of the runner or thin layer can be removed by standard wafer sawing equipment.

In an embodiment, the transparency of the first mold material of the at least one runner (20) is reduced is reduced locally or along the whole runner (20).

The at least one runner comprises the first mold material and can be treated such that the transparency is strongly reduced at some positions on or in the runner, i.e. locally, or along the whole runner profile. As a result little or no light can reach the light sensitive area of the optical sensor area via the runner. For example, laser light could be applied onto the runner, such that the first mold material of the runner is chemically or physically modified to obtain the reduction in transparency.

According to the proposed concept, an optical sensor comprises a semiconductor substrate with a main top surface and a main back surface. A first integrated circuit comprises at least one light sensitive component. The first integrated circuit is arranged on the substrate at or near the top surface.

The optical sensor is packaged by means of a wafer-level package. The package comprises a first mold structure which at least partly encloses the first integrated circuit. Furthermore, a second mold structure at least partly encloses the first mold structure.

In an embodiment, the first mold structure is at least partly optically transparent and the second mold structure is made at least partly optically opaque.

In an embodiment, the at least one light sensitive component comprises a photodiode, an infrared photodiode, a charge coupled device and/or a CMOS photosensor.

In an embodiment, the optical sensor comprises a second integrated circuit comprising at least one light emitting component, for example a light emitting diode. The second integrated circuit is arranged on the substrate of the wafer at or near the main surface. At least one further through substrate via is arranged through the wafer for electrically contacting the second integrated circuit via the back surface.

Furthermore, the first mold structure also at least partly, encloses the second integrated circuit. The second molding structure is arranged on or near the main surface and is designed to block light to be emitted by the at least one light emitting component from directly reaching the at least one light sensitive component. Alternatively or in addition, the second molding structure is arranged to block light emitted by the at least one light emitting component from indirectly reaching the at least one light sensitive component from unwanted directions, e.g. after reflection on a glass surface placed above the sensor.

With the second integrated circuit and the light blocking design of the second mold structure the optical sensor can be operated as a proximity sensor. Thus, the manufacture of optical sensor at the wafer-level in an integrated process can be further extended to producing optical proximity sensors.

Following the concept presented above, mold structures with different properties are applied at wafer-level to produce the optical sensor, and in particular, optically exposed areas and an enclosure surrounding the light sensitive components of the optical sensor to block light incident from the surface. Using multiple molding steps with different molds, e.g. transparent, opaque, and/or diffusive, reduces limitations and risks that are present when using opaque mold only on already singulated dice, and also adds flexibility.

All steps are done on wafer-level, reducing cost compared to solutions where single die handling is needed. All parts consisting of different molds (e.g., clear shapes, opaque walls) can be integrated at wafer-level, minimizing the footprint and assembly costs. All feature dimensions and geometrical specifications (e.g. tapering angle of the shapes, radius of corners, wall thickness etc.) are such that they meet the manufacturing requirements for wafer-level transfer molding.

For example, the combination of a first mold that is produced by cavities in the mold tool and a second opaque mold material does not need needle-like pin structures on the mold tool, such as the direct application of an opaque mold material would need to expose the light sensitive components of the optical sensor. Thus, the manufacturing is less prone to mechanical damage, reduces the pressure on the wafer and there is no risk of piercing a film. There is no risk of opaque mold flash on sensor surface during production.

The wafer-level package not only provides protection of the sensor but offers a more compact design. Smaller aperture openings are possible (negative draft) making the part less visible to end users. Furthermore, a smaller device size is possible. A flat top surface without cavities provides easier handling of the optical sensor. Integrated addition of a diffuser or other layers on the package is possible in the same process at wafer-level. In conclusion, the package meets manufacturing requirements for mass-produced molded structures.

An aperture may be created at a defined distance from the substrate. The integration at the wafer-level is flexible as it allows for integration of further layers, such as a diffuser layer, in a single integration process. This way, small packages can be produced in an efficient manner. All parts consisting of different mold material can be integrated at wafer-level, minimizing footprint and assembly cost.

In the following, the concept presented above is described in further detail with respect to drawings, in which example embodiments are presented.

DETAILED DESCRIPTION

Figure 1:
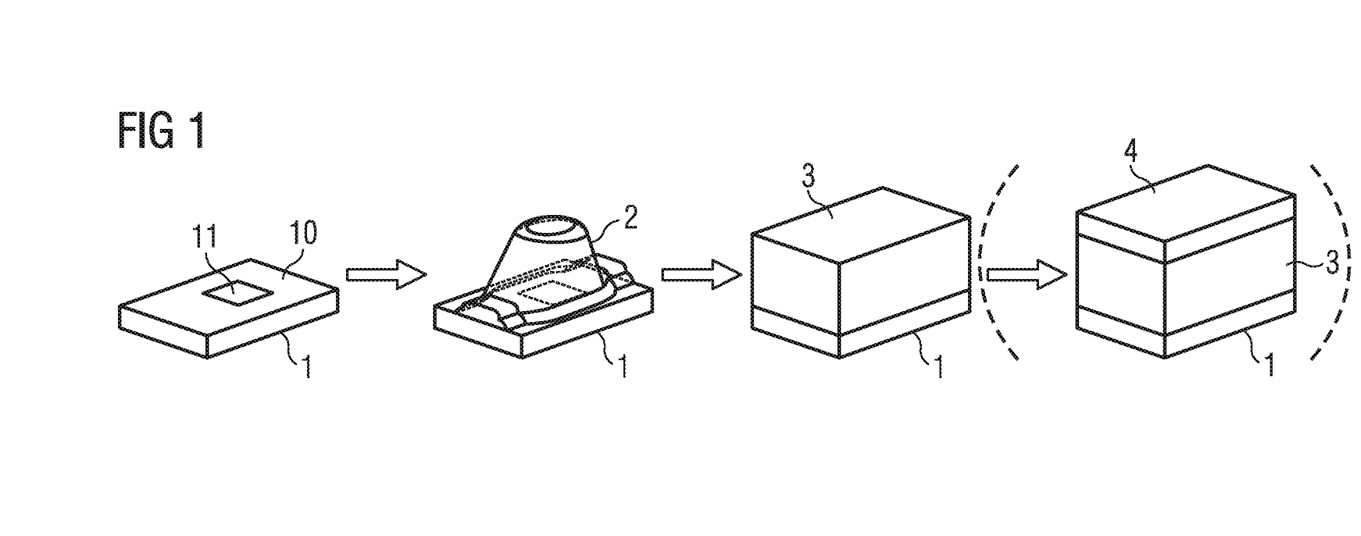
FIG. 1 shows an example embodiment of a method of producing an optical sensor.

FIG. 1 shows an example embodiment of a method of producing an optical sensor.

The drawing shows a schematic and generic process flow of the proposed method for manufacturing the optical sensor. The method can be summarized into four general steps which enable the entire processing of an optical sensor to be performed at the wafer-level, i.e. each of the elements of the sensor is either fabricated as part of a wafer 1, or attached to the wafer during wafer-level processing. The term wafer-level will be understood as being applied on a major portion of a substrate surface in one processing step. Molds with different properties are applied at wafer-level to produce optically exposed areas on each die or optical sensor, effectively leading to walls surrounding the light sensitive components that block light from the side, providing an integrated process to efficiently produce small packages.

A first step shown in the drawing relates to processing of a wafer front surface 10, for example by means of CMOS processing. The drawing depicts a wafer 1 having one or more dies arranged on its front surface. The dies comprise integrated circuits 11 each having at least one light sensitive component 12, i.e. the dies constitute optical sensors having a photodiode or infrared photodiode, for example. Typically, the wafer 1 comprises a multitude of integrated circuits 11 which are mounted side-by-side to each other. Each integrated circuit 11 is mounted on the top surface 10 of the wafer 1. Electrical connections to the backside or back surface 13 of the wafer 1 can established by through silicon vias 14, for example by means of through silicon via (TSV) processing. Furthermore, a redistribution layer can be arranged at the back surface of the wafer. The redistribution layer 15 may be a metal layer on the back surface that makes the input/output pads or terminals of the integrated circuits available in other locations. For example, the redistribution layer can be realized including an under-bump metallization on the wafer back surface.

A second step shown in the drawing relates to application of a first, transparent mold structure 2. After the wafer 1 has been prepared and assembled with electronic components and circuitry, a wafer-level package is constructed.

Following the proposed method, the transparent mold structure 2 is established by application of a structured layer of transparent mold compound to the wafer 1, in particular at optically exposed areas on the wafer top surface 10 such as the light sensitive components 12, for example. This second step can be applied to the whole wafer front surface 10 by wafer-level molding, such that it forms symmetrical, conical or otherwise tapered shapes, named the transparent mold structure 2 hereinafter, over the areas which are to be exposed to incident light.

The transparent mold structure 2 is manufactured by means of a mold tool having a cavity or a plurality of cavities that define the shape of the transparent mold structure 2 itself. The mold tool leaves a system of channels through which mold material can enter into the mold tools cavity such that the mold material can be transferred between them. This way a system of runners 20 comprising the transparent mold material is arranged on the wafer's front surface 10. The transparent mold structures 2 are connected with each other by means of the runners 20 (for details see Figures below).

Wafer-level molding may involve wafer-level liquid compression molding, wafer-level liquid compression molding, or other molding techniques. The wafer-level molding is applied onto the front surface 10 of the wafer 1 by means of an appropriate mold tool comprising at least one cavity which is to be filled by transparent mold material. Any thermosetting material can be used as molding material, such as epoxy or polyamide resins or silicones, for example. Further particles such as pigments, metal particles or nano particles can be added in order to fine tune mechanical and optical properties of the transparent mold.

A third step shown in the drawing relates to application of a second, opaque mold structure 3. The opaque mold structure 3 is applied on the wafer 1, e.g. to the whole still exposed wafer front surface 10. For example, this can be realized by pressing a flat or structured mold tool onto the top surface 21 of the transparent mold structure, and filling the resulting cavity between mold tool and wafer surface 10 with opaque mold material. The mold is designed such that the opaque mold structure 3 leaves open an aperture 30 on top of the top surfaces 21 of the transparent mold structures 2. This way the light sensitive components 12 are still exposed to incident light.

The resulting package including the transparent and opaque mold structures 2, 3 has a defined total height, an exposed top 21 and aperture 30 over the sensor, as well as opaque sidewalls 31 to block a large part of light incident from this side from reaching the light sensitive component 12.

Epoxy resins or silicones can be used as molding material, for example. Further particles such as pigments, metal particles or nano particles can be added in order to fine tune mechanical and optical properties of the opaque mold. For example, the same mold material can be used for both the transparent and opaque mold structure. By means of the additives the mold material can be made transparent or opaque. The terms transparent or opaque is defined as transparent or opaque with respect to light to be detected or emitted by means of the proposed optical sensors.

A fourth step shown in the drawing relates to an (optional) application of a diffuser layer 4. The diffuser layer 4 covers at least an area over the aperture 30 arranged in the opaque mold structure 3. The diffuser layer 4 assures that a certain portion of light from any incident angles striking in an area above the aperture 30 will reach the sensor or light sensitive components 12 by way through the aperture 30. The diffuser layer 4 may cover the complete surface 32 of the opaque mold structure or only a smaller amount thereof. The amount of this portion, for example, depends on the maximum or desired incident angle which should be collected by means of the optical sensor. This results in a wider ambience angular field of view, while the incident angles on the optical sensor (fields of view seen by the sensor) is still within certain boundaries.

Figure 2:
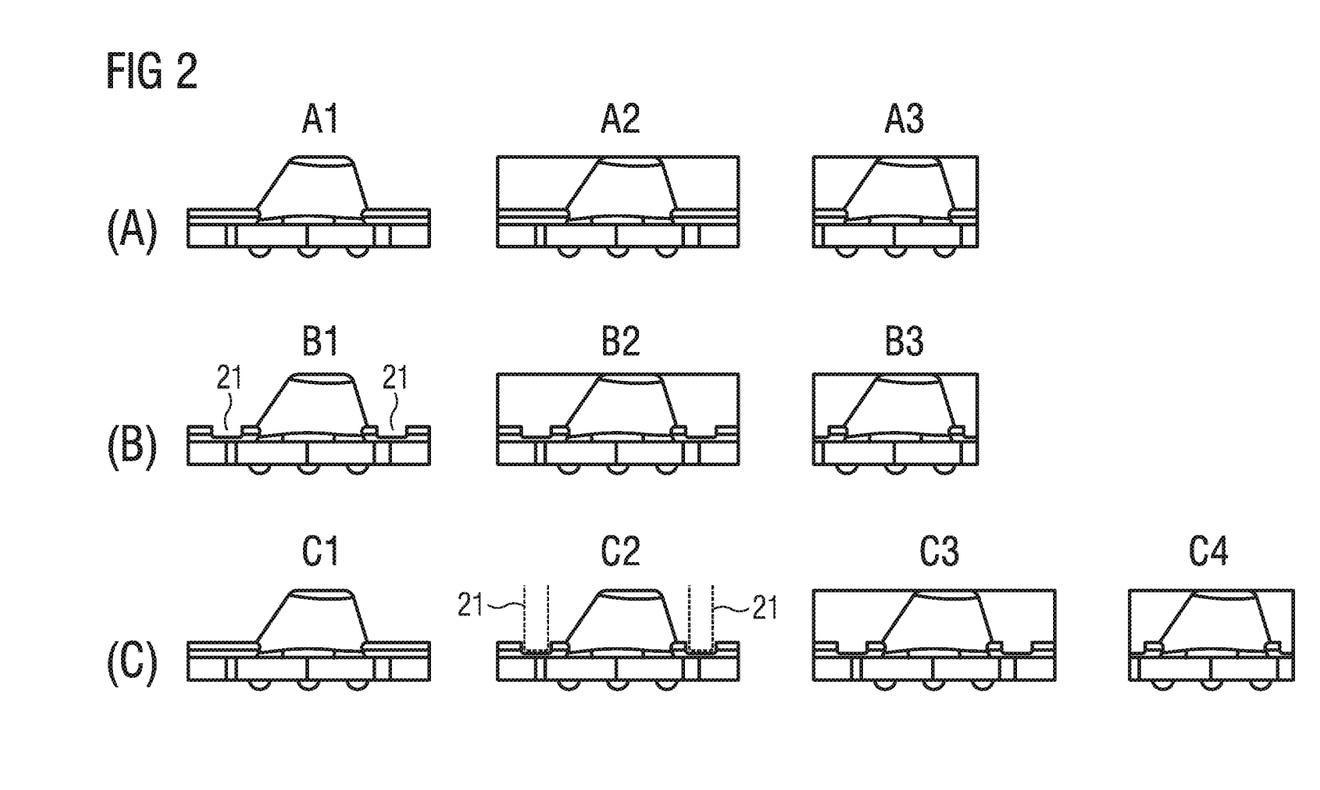
FIG. 2 shows further example embodiments of a method of producing an optical sensor.

FIG. 2 shows further example embodiments of a method of producing an optical sensor.

The drawing shows six different embodiments A to F of the method of producing the optical sensor, whose differences will be discussed below. Basically, the different pre-processed manufacturing solutions differ in different treatment of runners 20. In all six different embodiments A to F of the method of producing the optical sensor the first step, i.e. processing of a wafer front surface has already been finished. The drawing shows only a single optical sensor for easier representation. Typically, a larger number of optical sensors are mounted to the wafer and produced in the wafer-level manufacturing method described below. Furthermore, not all reference numerals are shown for better representation. For details refer to FIG. 3, for example.

Embodiment A can be considered the basic approach which can be further adapted by processing steps introduced with embodiments B to F. In embodiment A the transparent mold structure has been applied to the front face of the wafer (step A1). In this approach the runners connecting the different transparent mold structures essentially have a constant cross section. In a next step A2 the opaque mold structure is applied using another mold tool as described above. After the wafer with the optical sensors has been manufactured the wafer is singulated and single optical sensors can be achieved by sawing (step A3).

Embodiments B is different to embodiment A only in that transparent mold structure comprises reduced runners 20, i.e. the cross-section of the runners is not constant along the top surface. For example, the runners comprise a narrowing 21 along their lateral profile. The cross-section of the runners 20 can be altered by means of sawing after the mold has been applied or by means of a mold tool which constrains their structure during application of the mold material. Steps B1 and B2 correspond to steps A2 and A3 in embodiment A.

Step C1 of embodiment C constitutes a further development of embodiments A or B. The first step C1 may involve runners with constant or altered cross-sections as introduced above. In a further step C2, however, the runners are at least partially sawed away by means of a saw 22 before the opaque mold structure is applied. Step C2 is followed by application of the opaque mold structure (step C3) and singulation step C4.

Embodiment D only differs from embodiment C in that the sawing step D2 completely cuts into the runners and further even partly penetrates into the substrate of the wafer. Thus, sawing may involve the runners 20 and, additionally, partial sawing of the saw street. Steps D1, D3, and D4 correspond to steps C1, C3, and C4, respectively.

Embodiment E involves runner removal by means of masking and etching. Steps E1, E5, and E6 correspond to steps C1, C3, and C4, respectively. However, in step E a mask layer 23 is applied over the transparent mold structure 2. The mask layer 23 at least partially covers the transparent mold structure 2. Most part of the runners 20, however, is not covered by the mask layer 23 and can be exposed to an etching substance.

In step E3 the runners 20 are removed by means of isotropic or anisotropic etching while the transparent mold structure 2 is protected from etchant by the masking layer 23 having a material which resists etching. Next, the mask layer 23 is removed, for example, by chemical means, so that the transparent mold structure is restored, followed by application of the opaque mold structure 3 (step E5) and singulation step E6.

In embodiment F runners 20 are removed by means of unmasked etching. Different to embodiment E isotropic or anisotropic etching is directly applied to the transparent mold structure 2 without any intermediate mask layer present. Thus, the etchant effectively reduces the size of the transparent mold structure 2 by etching away the transparent mold material (see dashed line). At the same time the runners 20 are reduced or completely removed as well. Steps F1, F3, and F4 correspond to steps E1, E5, and E6, respectively.

Figure 3:
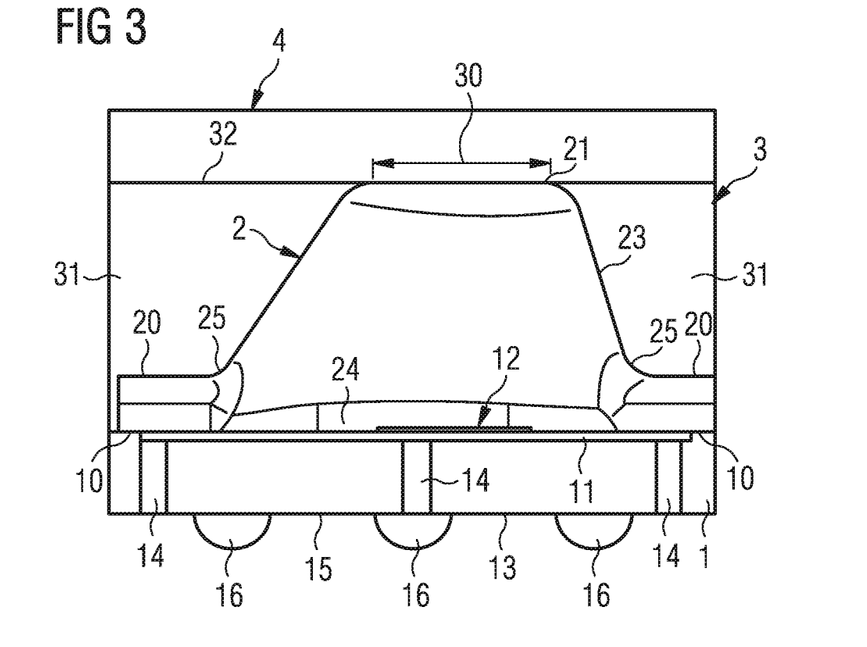
FIG. 3 shows an example embodiment of an optical sensor.

FIG. 3 shows an example embodiment of an optical sensor.

The drawing depicts a cross-section of a proposed structure of a wafer-level package including an additional diffuser layer 4. The optical sensor has been manufactured at wafer-level by means of any of the methods described above. In a final step the wafer carrying a plurality of optical sensor has been singulated to final packages as the one shown in FIG. 3.

The optical sensor comprises a substrate having several through silicon vias 14 electrically connecting its front and back surface 10, 13. Solder balls 16 are arranged on the back surface 13 of the optical sensor. An integrated circuit 11 is mounted on the front surface 10 and comprises the light sensitive component 12. The integrated circuit 11 is electrically connected to the back surface 13 of the substrate by means of the through silicon vias 14 and solder balls 16.

The transparent mold 2 is arranged on the integrated circuit 11 having the light sensitive component 12 and aligned with respect to an aperture 30. The mold structure 2 forms slightly tapered shapes over the exposed areas, i.e. the light sensitive components. The shapes feature a top surface 21 of low curvature and are enclosed by the aperture 30 in the opaque mold structure 3. The tapering of sidewalls 23 of the mold structure 2 is negative, i.e. is arranged such that the bottom 24 of the transparent mold structure 2, which is connected to the integrated circuit, is larger than at the top 21. Runners 20 are left from the application of the transparent mold structure and are arranged at the side 25 of the transparent mold structure 2.

The transparent mold structure 2 in this case is not completely symmetric but rather has sidewalls 23 with different angles of inclination. This accounts for the actual placement of the light sensitive component 12 with respect to the substrate. In this particular embodiment, the light sensitive component 12 is somewhat shifted with respect to a centerline of the transparent mold structure 2. In other embodiments the light sensitive component 12 can be centered with respect to the centerline. In other words, the shape of the transparent mold structure 2 can be adjusted to fit the position of the light sensitive component 12.

Furthermore, the transparent mold structure can have further optical properties, for example, the top surface 21 near the aperture 30 can have optical lens shape and may focus incident light towards the light sensitive component 12.

The transparent mold structure 2 is enclosed by the opaque mold structure 3 leaving only open the area of the aperture 30 on top of the transparent mold structure 2. The opaque mold structure 3 shields the optical sensor from optical stray light and effectively constitutes a wall 31 of the sensor package. The opaque mold structure 3 essentially is coplanar or flash within the aperture 30, i.e. top surface 21 of the transparent mold structure 2. Basically, this property is implemented by the specific manufacturing method described above but can be assisted with further planarizing or sawing.

On top of the opaque and transparent mold structure a diffuser layer is arranged and covers the whole cross-section of the optical sensor. The diffuser layer may also be applied to the optical sensor package by means of wafer-level molding presenting an efficient way to integrate an adjustable diffusion into the package. Alternatively, the diffuser layer may be added by other means, for example by adhering a pre-fabricated diffuser layer to the top surface 32.

Figure 4:
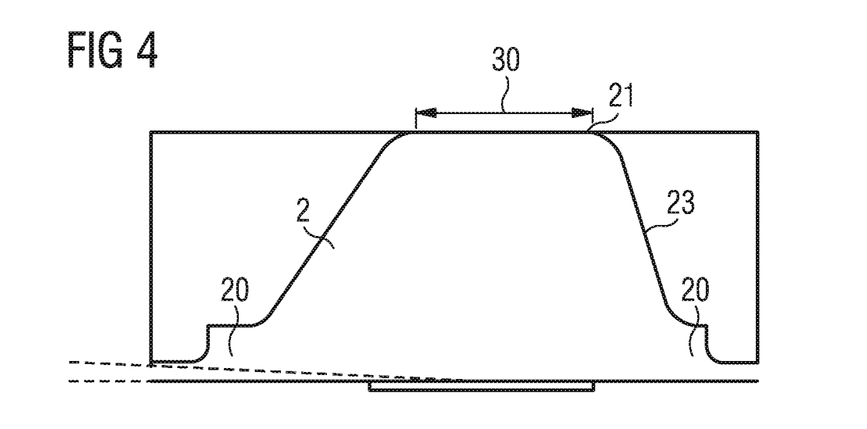
FIG. 4 shows another example embodiment of an optical sensor.

FIG. 4 shows another example embodiment of an optical sensor.

The drawing depicts an optical sensor manufactured according to the methods explained above with respect to embodiment A in FIG. 2, for example. Ambient or parasitic light may enter the optical sensor from a small incident angle range via the runner 20. Thus, the runners 20 may be a source of unwanted cross-talk which, depending on the application, should be avoided. Partly or complete removal of the runners 20 and subsequent covering by means of thin metal layer of the opaque molding structure 3 (see embodiments in FIG. 2, for example) can effectively reduce the impact of ambient or parasitic light.

Figure 5:
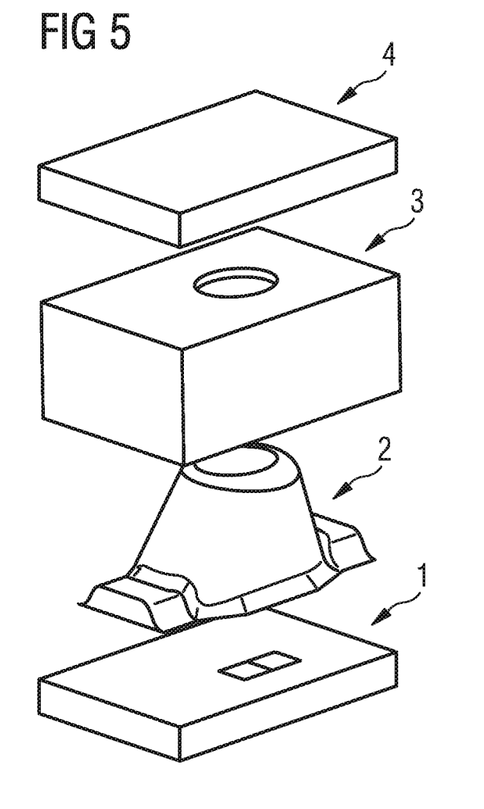
FIG. 5 shows an explosion view of an example embodiment of an optical sensor.

FIG. 5 shows an explosion view of an example embodiment of an optical sensor.

The drawing depicts the parts of the final wafer-level package after singulation into a single optical sensor, including the optional diffuser layer. Not all reference numerals are shown for better representation. For details refer to FIG. 3, for example.

The combination of transparent and opaque mold at wafer-level can expose optical sensor areas such as the light sensitive component of the integrated circuit without many of the limitations in alternative approaches, and adds flexibility for custom functionality, such as an integrated diffuser, in a cost-efficient way. For example, existing solutions have to press a mold tool onto defined areas of the wafer to keep them exposed in the opaque molding step. In many cases, this is not feasible (e.g., small size or sensible structures such as wire bonds).

The proposed method uses a structured transparent mold to expose areas, e.g. the light sensitive component or an additional light source, without the need to contact those structures directly with a mold tool. Transparent mold structures are formed selectively above exposed areas. No portion of the transparent encapsulant has to be removed, and a subsequent opaque mold is applied before singulation, i.e. still on wafer-level.

The subsequent addition of an opaque mold structure keeps the areas exposed by means of the aperture while shielding the surfaces of the optical sensor so that stray light cannot enter, e.g. as light emitted from the cell phone's white LED backlighting. The opaque mold is added without the need to form grooves, and without the need to remove the material above the apertures, further simplifying the method.

Additional flat or structured layers such as an on-chip diffuser can be added efficiently at the wafer-level. It is important to note that all steps are done at wafer-level. The design meets demanding manufacturing requirements for molded structures which specify minimum feature size and minimum radius of curvature.

More particularly, the wafer-level optical sensor package is composed of a first optically transparent material in the electromagnetic frequency regime to be detected. Due to the use of wafer-level technology such as wafer-level transfer molding process, there are runners between sensor areas. The cross section of these runners can either be minimized or removed by a dicing- or equivalent masked or mask less isotropic/anisotropic etching process before applying the opaque mold structure. In this way, parasitic side light blocking is improved because there is no transparent material at the sidewalls of a wafer-level packaged chip after dicing (singulation).

No singulation is done until the transparent and opaque mold structures are both molded at wafer-level. That is, the die or integrated circuit is not embedded but the wafer front is covered in the structured molding layers. Specifically, the back face of the molding structures is coplanar with the front face of the wafer, and the front face is at a defined distance from the wafer, this increase of height is a specific advantage.

The invention claimed is:

1. A method of producing an optical sensor at wafer-level, comprising the steps of:
   providing a wafer having a top surface and a back surface;
   arrange at or near the top surface of the wafer at least one first integrated circuit having at least one light sensitive component;
   providing in the wafer at least one through-substrate via for electrically contacting the back surface;
   forming a first mold structure by wafer-level molding a first mold material over the top surface of the wafer using a first structured mold tool, such that the first mold structure at least partly encloses the light sensitive component; and
   subsequently forming an at least partially opaque second mold structure by wafer-level molding an optically opaque second mold material over the first mold structure using a flat or structured second mold tool, such that the second mold structure at least partly encloses the first mold structure, wherein the second mold material is applied to the second mold tool to form the second mold structure and to leave an aperture at or near the top surface of the first mold structure, wherein the aperture is co-planar or flush with an at least partially transparent portion of the top surface of the first mold structure.

2. The method according to claim 1, wherein the
   the first mold structure is made at least partly transparent by using an optically transparent mold material as first mold material.

3. The method according to claim 1, wherein
   the first mold tool comprises at least a first mold cavity, a conical or otherwise tapered first mold cavity;
   the first mold tool is placed at or near the top surface of the wafer; and
   the first mold material is applied to the cavity via a gap to form the first mold structure.

4. The method according to claim 1, wherein
   the second mold tool is placed on the wafer at or near the top surface of the first mold structure.

5. The method according to claim 1, wherein one or more additional flat or structured mold layers are applied to the wafer at or near the top surface of the second mold structure, in particular one or more diffuser layers.

6. The method according to claim 1, wherein before or after wafer-level molding the first and second molding structure
   a redistribution layer comprising at least one metal layer is arranged on the back surface of the wafer; and
   the at least one through-substrate via is electrically connected with the redistribution layer.

7. The method according to claim 5, wherein the redistribution layer is provided with an under-bump metallization layer for the attachment of one or more bumps, and/or provided before or after wafer-level molding of the first and the second molding structures.

8. The method according to claim 1, wherein
   the wafer is provided with a plurality of first integrated circuits each having a light sensitive component;
   the first and second mold structure are applied to the front surface of the wafer or applied to an entirety of the front surface of the wafer; and
   the wafer is singulated into individual optical sensors each comprising at least one of the first integrated circuits.

9. The method according to claim 8, wherein the structured first mold tool comprises a plurality of cavities each of which are interconnected by channels allowing mold material to flow between the cavities during wafer-level molding.

10. The method according to claim 9, wherein at least one runner comprising first mold material resulting from flowing through the channels between the cavities during wafer-level molding is at least partly removed, or removed by isotropic or by anisotropic etching, and/or by mechanical removal, by sawing or by dicing.

11. The method according to claim 9, wherein the at least one runner is at least partly replaced by a thin layer distributed throughout the front surface of the wafer.

12. The method according to claim 9, wherein a transparency of the first mold material of the at least one runner is reduced is reduced locally or along the whole runner.

* * * * *